(12) United States Patent
Guha et al.

(10) Patent No.: US 8,181,594 B2
(45) Date of Patent: May 22, 2012

(54) METHOD AND APPARATUS FOR FABRICATING OR ALTERING MICROSTRUCTURES USING LOCAL CHEMICAL ALTERATIONS

(75) Inventors: Supratik Guha, Chappaqua, NY (US); Hendrik F. Hamann, Yorktown Heights, NY (US); Herschel M. Marchman, Poughquag, NY (US); Robert J. Von Gutfeld, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1076 days.

(21) Appl. No.: 11/931,242

(22) Filed: Oct. 31, 2007

(65) Prior Publication Data

US 2008/0057719 A1  Mar. 6, 2008

Related U.S. Application Data

(63) Continuation of application No. 10/696,771, filed on Oct. 29, 2003, now Pat. No. 7,329,361.

(51) Int. Cl.
*B05C 11/00* (2006.01)

(52) U.S. Cl. ............... 118/58; 216/17; 216/55

(58) Field of Classification Search .......... 118/58; 216/17, 55; 438/52; 219/494, 510, 17, 55
See application file for complete search history.

(56) References Cited

U.S. PATENT DOCUMENTS

| | | | |
|---|---|---|---|
| 4,283,259 A | 8/1981 | Melcher et al. | |
| 4,559,115 A | 12/1985 | Inoue | |
| 5,537,372 A | 7/1996 | Albrecht et al. | |
| 6,078,259 A * | 6/2000 | Brady et al. | 340/572.7 |
| 6,084,849 A | 7/2000 | Durig et al. | |
| 6,218,086 B1 | 4/2001 | Binnig et al. | |
| 6,233,206 B1 | 5/2001 | Hamann et al. | |
| 6,291,302 B1 | 9/2001 | Yu | |
| 6,413,408 B1 | 7/2002 | Berger et al. | |
| 6,433,310 B1 * | 8/2002 | Wickramasinghe et al. | 219/216 |
| 6,510,120 B2 | 1/2003 | Wickramasinghe et al. | |
| 6,642,129 B2 | 11/2003 | Liu et al. | |
| 6,762,402 B2 | 7/2004 | Choi et al. | |
| 6,773,764 B2 | 8/2004 | Marinero et al. | |
| 7,329,361 B2 | 2/2008 | Guha et al. | |
| 2002/0101795 A1 * | 8/2002 | Wickramasinghe et al. | 369/43 |
| 2002/0101812 A1 * | 8/2002 | Wickramasinghe et al. | 369/99 |
| 2002/0110063 A1 * | 8/2002 | Yamada et al. | 369/47.39 |
| 2003/0048744 A1 * | 3/2003 | Ovshinsky et al. | 369/275.2 |
| 2003/0222965 A1 | 12/2003 | Field | |
| 2004/0033679 A1 | 2/2004 | Jacobson et al. | |
| 2004/0036944 A1 * | 2/2004 | Tsu | 359/241 |
| 2004/0101469 A1 | 5/2004 | Demers | |
| 2004/0142106 A1 | 7/2004 | Mirkin et al. | |

OTHER PUBLICATIONS

Vettiger, et al., "The "Millipede"—More than one thousand tips for future AFM data storage," IBM J. Res. Develop. 44(3), May 2000, 323-340.

Haight, et al., "MARS: Femtosecond laser mask advanced repair system in manufacturing," J. Vac. Sci Tech B, 17, 3137 (1999).

* cited by examiner

*Primary Examiner* — Binh X Tran

(57) ABSTRACT

A method and apparatus for fabricating or altering a microstructure use means for heating to facilitate a local chemical reaction that forms or alters the submicrostructure.

20 Claims, 7 Drawing Sheets

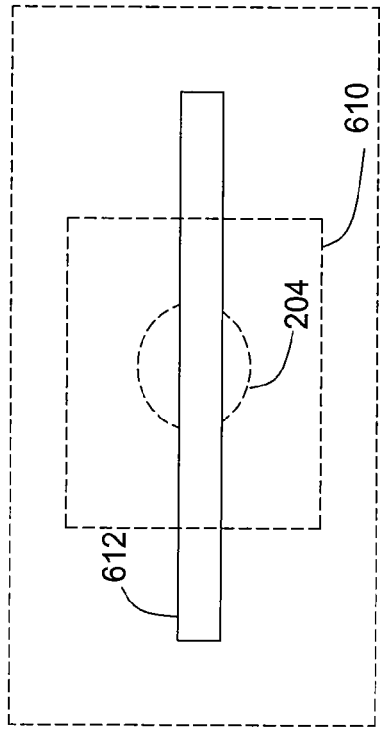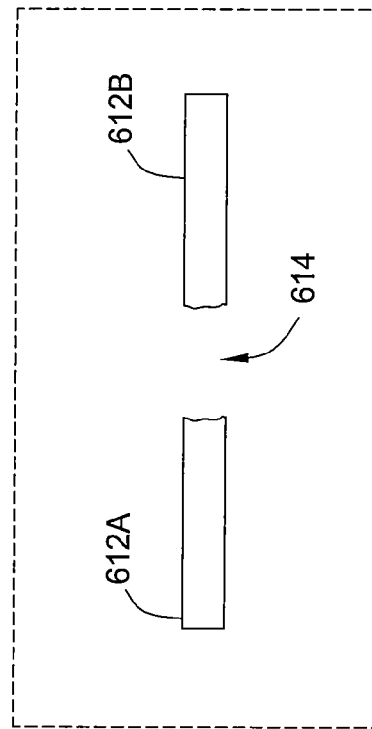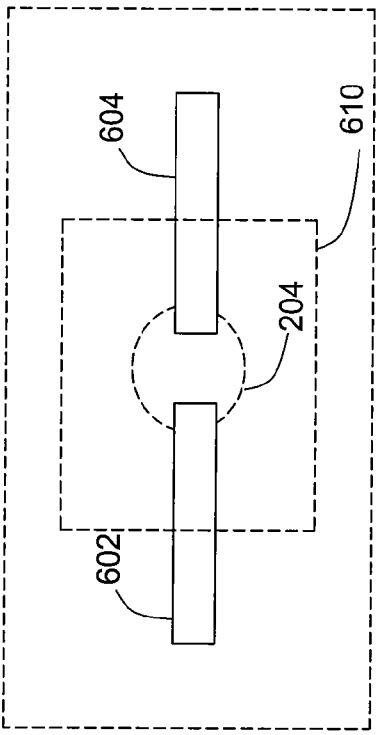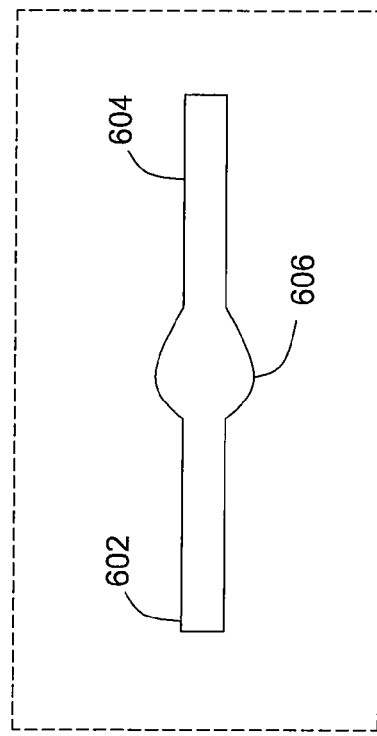
FIG. 6A
FIG. 6B
FIG. 6C
FIG. 6D

METHOD AND APPARATUS FOR FABRICATING OR ALTERING MICROSTRUCTURES USING LOCAL CHEMICAL ALTERATIONS

CROSS REFERENCE TO RELATED APPLICATIONS

This application is a continuation of U.S. patent application Ser. No. 10/696,771, filed Oct. 29, 2003 (now U.S. Pat. No. 7,329,361), which is herein incorporated by reference in its entirety.

BACKGROUND OF THE INVENTION

1. Field of the Invention

The present invention generally relates to a method and apparatus for fabricating or altering microstructures. More specifically, the present invention relates to fabricating or altering submicrostructures using local chemical alterations facilitated by a heating means, e.g., a thermal transducer or a nanoheater.

2. Description of the Related Art

Devices such as integrated circuits, lithographic reticles/masks, and recording media, among others, comprise various microstructures that perform critical functions within the device. Such microstructure are generally formed on substrates (e.g., semiconductor or glass substrates, plastic discs, and the like) and include portions of electronic circuits (e.g., conductive lines, vias, transistors, insulative layers) and optical circuits, such as transparent, opaque, and phase-shifting regions of the reticles/masks, reflective regions of recording media, and the like.

Methods used to repair, as well as manufacture the microstructures exploit a plurality of technologies, such as laser heating, thermo-mechanical machining, electron and ion beam machining, along with an array of technologies used in fabrication of integrated circuits. However, in applications such as making alterations or repairing defects in lithographic reticles/masks or integrated circuits, patterning information in recording media, and the like, these technologies are frequently inefficient or cannot provide a localized action (i.e., resolution) needed to manufacture a desired microstructure or correct the defect.

Therefore, there is a need in the art for an improved method and apparatus for fabricating or altering microstructures.

SUMMARY OF THE INVENTION

In one embodiment, the present invention discloses a method of fabricating or altering microstructures (or submicrostructures such as nanostructures in one embodiment) using a heating means such as a thermal transducer or a nanoheater that facilitates a local chemical reaction to form or alter a nanostructure. Exemplary applications of the method include forming and altering portions of integrated circuits and lithographic reticles/masks, patterning information on recording media, and the like.

Another aspect of the invention is an apparatus performing the inventive method.

BRIEF DESCRIPTION OF THE DRAWINGS

The teachings of the present invention can be readily understood by considering the following detailed description in conjunction with the accompanying drawings, in which:

FIGS. 6A-6D depict a series of schematic, top plan views of objects having microstructures being fabricated using the method of FIG. 1.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method and apparatus for fabricating or altering microstructures using a heating means, e.g., a thermal transducer or a nanoheater that facilitates a local chemical reaction to form a microstructure. Throughout the present disclosure, the terms "thermal transducer" and "nanoheater" are interchangeably used, but it should not be interpreted as limiting the present invention. However, generally we refer to thermal transducer where a larger heat spot is reduced via geometrical to a smaller heat spot while the nanoheater generates a very small heat spot directly. Herein, the term "microstructure" relates to portions of devices and integrated circuits that are formed or repaired using the inventive method. It should also be noted that the present invention may operate at a very localized region of an object, to fabricate or alter a "submicrostructure", e.g., a nanostructure on the object. Thus, by fabricating or altering the "submicrostructure" of the object, it is understood that a "microstructure" of the device can be altered or fabricated. The term "local" relates to a very small region of the object, e.g., where a nanostructure being altered or fabricated is less than or equal to an area of 0.1×0.1 micrometer square. Thus, heating a local region of the object means that a small region of the object is locally heated such that a chemical reaction may occur to produce a nanostructure having an approximate area of 0.1×0.1 micrometer square or less.

Figure 1:
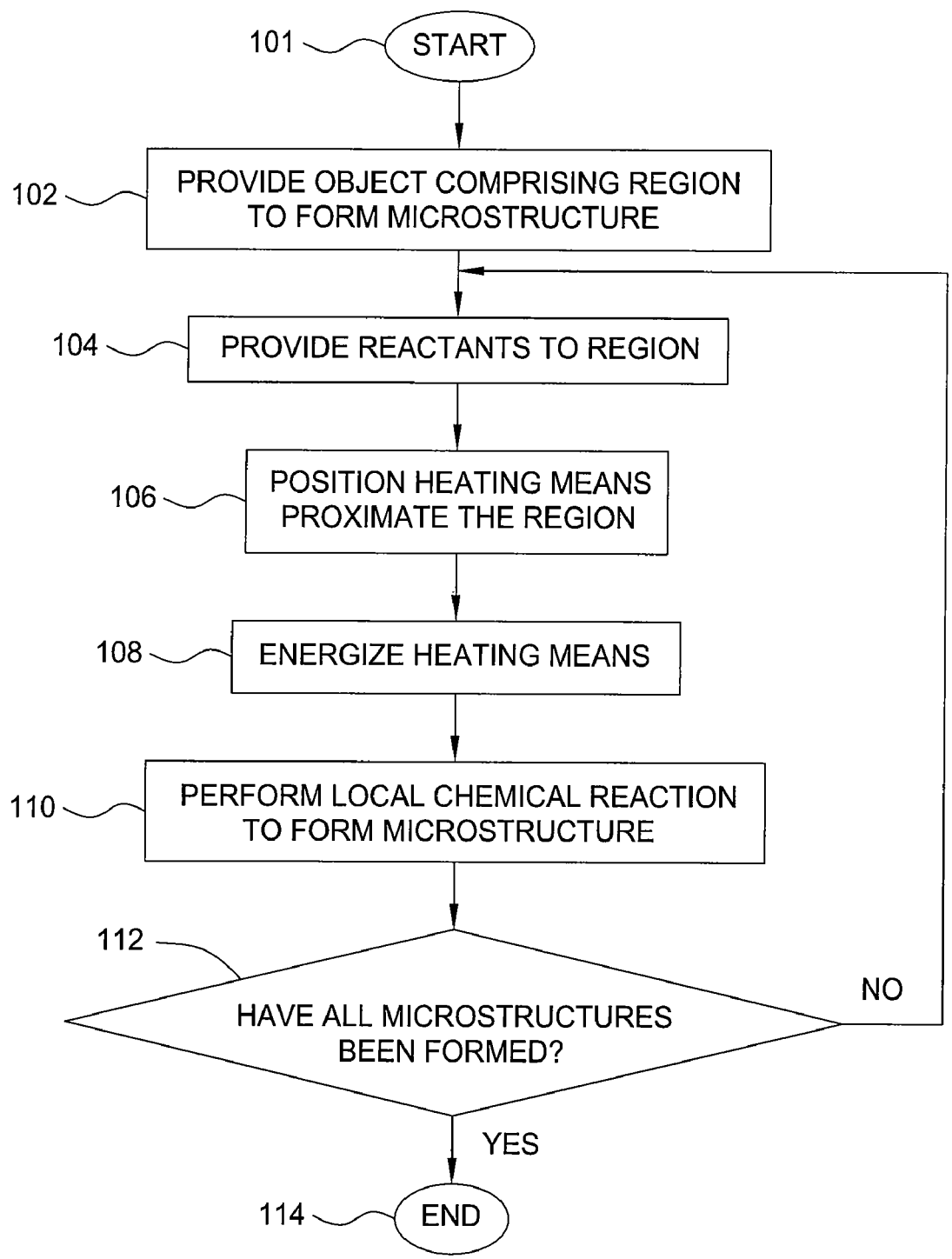
FIG. 1 depicts a flow diagram of a method for fabricating or altering microstructures in accordance with one embodiment of the present invention.

FIG. 1 depicts a flow diagram for one embodiment of the inventive method for fabricating microstructures as a method 100. The method 100 includes the processing steps that are performed upon an object where at least one microstructure is formed or altered.

Figure 2:
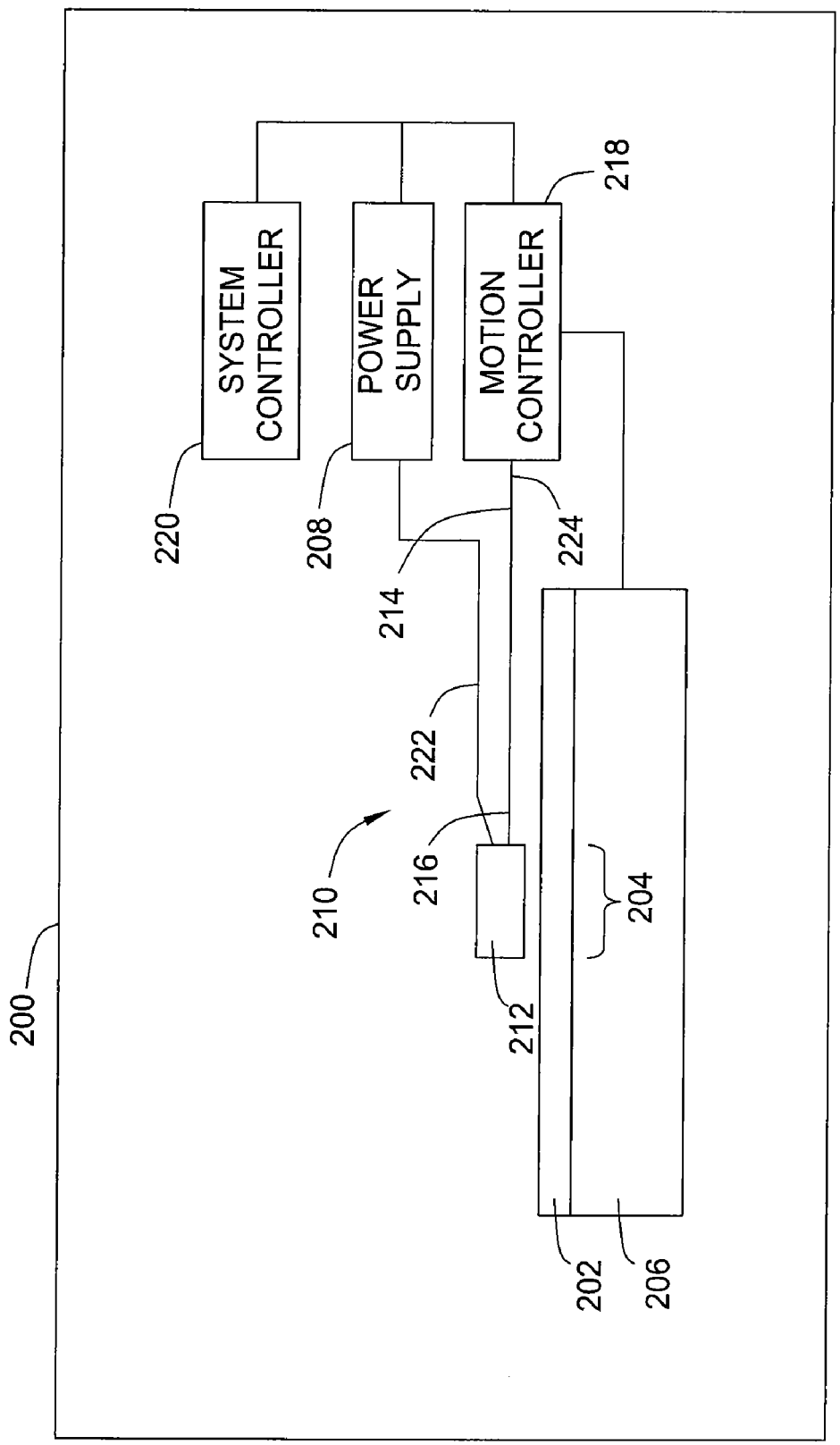
FIG. 2 depicts a schematic diagram of an exemplary apparatus performing the method of FIG. 1.

FIG. 2 depicts a schematic diagram of an exemplary apparatus 200 performing the method of FIG. 1 in accordance with one embodiment of the invention. The images in FIG. 2 are not depicted to scale and are simplified for illustrative purposes. To best understand the invention, the reader should simultaneously refer to FIG. 1 and FIG. 2.

The method 100 starts at step 101 and proceeds to step 102. At step 102, an object 202 (e.g., semiconductor or glass substrate, plastic disc, and the like) having one or more regions 204 where a microstructure should be formed (one region 204 is shown) is provided to the apparatus 200 and positioned on a support pedestal 206, which comprises typically a piezo electric module. In operation, a system controller 220, in a conventional manner, controls operation of the apparatus 200.

At step 104, reactants that can be used to form the desired microstructure are selectively supplied, at an ambient temperature, to the region 204 or, alternatively, to a plurality of such regions. For most applications, a rate of a chemical reaction is exponentially proportional to the absolute temperature. As such, at the ambient temperature, the reactants do not react or react at a very low rate.

Figure 3:
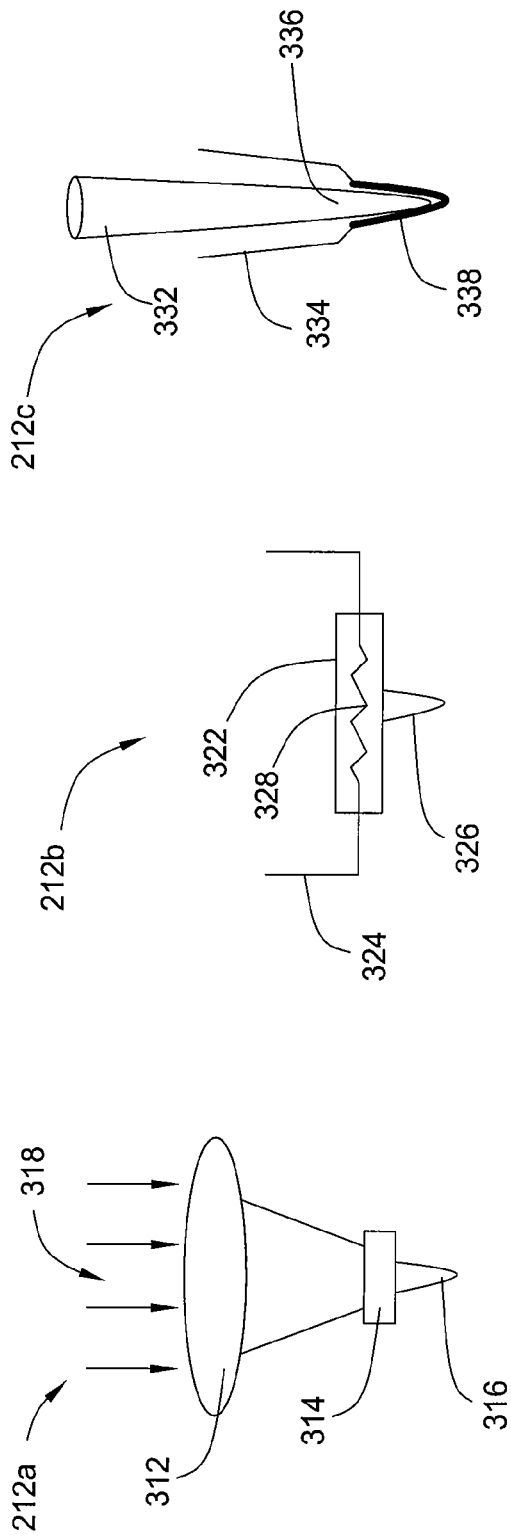
FIGS. 3A-3D depict schematic diagrams of various embodiments of a thermal transducer and nanoheater of the kind that may be used in the apparatus of FIG. 2.

At step 106, means for heating a region 210 is positioned proximate the region 204. In one embodiment, the means for heating a region 210 may comprise a thermal transducer or a nanoheater, which is attached 212 (e.g., an electrical nanoheater) to a flexible cantilever 214. Such thermal transducers and nanoheaters are disclosed, for example, in commonly assigned U.S. Pat. No. 6,532,125, issued Mar. 11, 2003, and U.S. Pat. No. 6,433,310, issued Aug. 13, 2002, which are incorporated herein by reference. Salient features of the nanoheaters and thermal transducers are discussed below in reference to FIG. 3, wherein suffixes "a" through "d" are used to differentiate between various embodiments of the thermal transducer and nanoheaters. In the depicted preferred embodiment, the means for heating the region 210 illustratively comprises an electric nanoheater 212d.

The nanoheater 212d is located near a first end 216 of the cantilever 214 while second end 224 is coupled to a motion controller 218 that, in operation, positions the nanoheater 212d proximate to the region 204. In one embodiment, the motion controller 218 determines positioning of both the nanoheater 212d and support pedestal 206. The nanoheater 212d comprises a heat-emitting surface facing the region 204 and having topographic dimensions in a range from about 10 to 100 nm.

At step 108, the means for heating the region 212, e.g., a nanoheater, is energized (i.e., heated to a pre-determined temperature) via interface 222 using a power supply 208. By interface we mean, for example, electrical leads or an optical fiber, which supplies the power to a thermal transducer or nanoheater. Typically, the nanoheater 212 is energized using one or more short pulses of electrical current, radiant energy, and the like. Generally, the interface 222 is disposed within the cantilever 214. In an alternative embodiment (not shown), step 108 may be performed prior to step 106.

At step 110, the nanoheater 212d locally increases temperature of the reactants disposed proximate to the heat-emitting surface of the nanoheater (i.e., in the region 204). The high temperature of the reactants facilitates a local chemical reaction (discussed in detail below in reference to FIG. 4) between the reactants that forms, in the region 204, the desired microstructure. Upon completion of the local chemical reaction, the power supply 208 terminates energizing the nanoheater 212, and the motion controller 218 moves the nanoheater away from the region 204.

At step 112, the method 100 queries if all microstructures have been formed or altered. If the query of step 112 is negatively answered, the method 100 proceeds to step 104 to continue fabrication or alteration of the microstructures on the substrate 202. If the query of step 112 is affirmatively answered, the method 100 proceeds to step 114, where the method 100 ends.

FIGS. 3A-3D depict schematic diagrams of exemplary embodiments of the nanoheater 212. The images in FIGS. 3A-3D are not depicted to scale and are simplified for illustrative purposes. FIGS. 3A-B are examples for thermal transducer where a larger heat spot is "concentrated" via geometrical means to a smaller heat spot. FIGS. 3C-D are examples for nanoheaters, where a small heat spot is directly generated.

FIG. 3A depicts a schematic diagram of a laser-powered thermal transducer 212a comprising a lens 312 that focuses a laser beam 318 on a thermally conductive plate 314, which could be part of a cantilever having a nano-tip 316. In operation, the laser beam 318 heats the plate 314 that conducts the heat to the nano-tip 316 disposed proximate the region 204 to facilitate the local chemical reaction.

FIG. 3B depicts a schematic diagram of an electrical thermal transducer 212b comprising a heater element 328 embedded in a thermally conductive plate 322 and power leads, or transmission lines, 324. The plate 322 has a nano-tip 326 that operates similar to the nano-tip 316.

FIG. 3C depicts a schematic diagram of another electrical nanoheater 212c comprising a resistive element 338 applied to a nano-tip 336 of a support 332, as well as transmission lines 334. The support 332 is formed from a material having low thermal conductivity to facilitate, in operation, high temperature of the nano-tip 338 and, as such, high rate of the local chemical reaction.

FIG. 3D depicts a schematic diagram of a preferred electrical nanoheater 212d comprising heater element 342 electrically coupled to transmission lines 344 that, together, form the interface 222. In one embodiment, the heater element 342 and transmission lines 344 are embedded in the cantilever 214. In operation, a heat-emitting surface 346 of the nanoheater is disposed proximate the region 204. In one embodiment, an optional thermally conductive medium (e.g., chemically inert lubricant) may be applied to the heat-emitting surface 346 to increase, in the region 204, thermal coupling between the heater element 342 and the reactants. In another embodiment, a "soft contact" (i.e., contact excerpting no pressure) may be established between the heater element 342 and substrate 202 to minimize thermal losses in a conduction pass from the heater element to the region 204. In a further embodiment, the reactants may be used to form the conduction pass.

The following considerations may be used as guidelines when choosing a material of the heater element 342: (i) it is preferred to use chemically inert materials (e.g., gold (Au), platinum (Pt), and the like) and/or apply protective coatings (e.g., silicon dioxide ($SiO_2$) to the heat-emitting surface 346, and (ii) the material should have a high melting point. When the heater element 342 has a direct contact with the substrate 202, use of a "hard" material (e.g., platinum-iridium (PtIr) alloy) is advantageous in order to avoid wear out of the heater element. To minimize spreading of the heat, a material with low heat conductivity ($\lambda < 100$ W/mK), as well as the material with a negative temperature dependence of the heat conductivity may be chosen. While low heat conductivity of the heater element is advantageous for confining the heat, it is less an advantage for heating efficiently without any loading from the object. In order to minimize heating of the transmission lines 344, it is preferred that the resistivity or sheet resistance of the material of the heater element is large (e.g., $>1\Omega$ per square). The heater element may generally be of any kind of shape (e.g., square, annular, and the like). When the substrate requires heat spots with a certain shapes, a wave-like shape may be advantageous.

To minimize spreading of the heat in the nanoheater 212d, the transmission lines 344 should have high electrical conductivity and large cross-sectional area, as well as, preferably, low thermal conductivity. It is preferred that the transmission lines do not protrude through a lower surface 348 of the cantilever 214. The choice of a material of the cantilever 214 may be guided by the Young's modulus of the material, which along with other parameters (e.g., dimensions and shape), determine a spring constant of the cantilever, as well as by thermal conductivity of the material. Spring constants can vary from 0.0001 N/m to 1000 N/m depending on a surface hardness of the heater element 342 and substrate 202. Generally, materials with high thermal conductivity are preferred. One suitable material for the cantilever 214 may be intrinsic silicon (Si).

Figure 4:
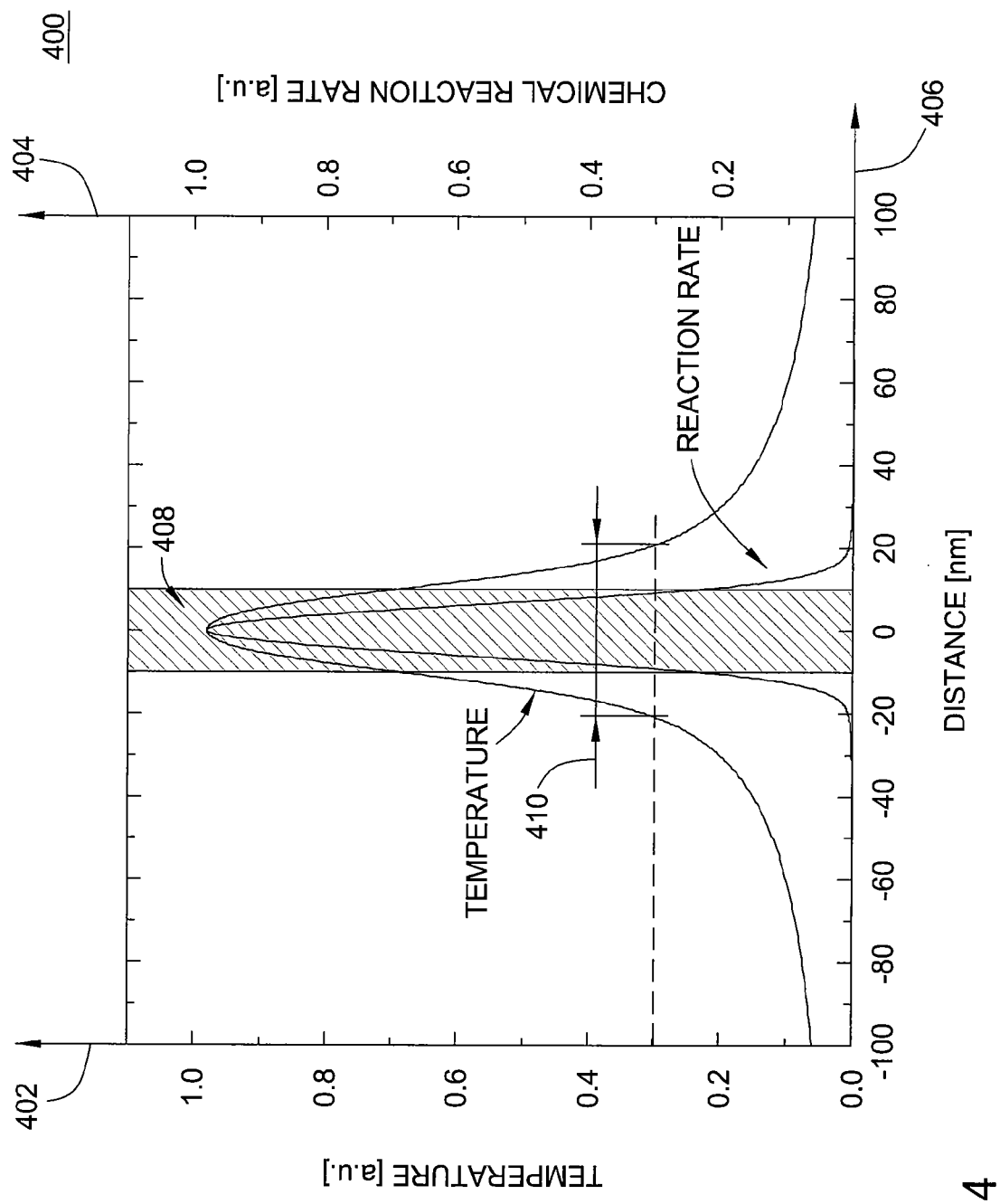
FIG. 4 depicts a series of exemplary graphs illustrating dependence of local temperature distribution and chemical reaction rate using the nanoheater (means of heating) of FIG. 3D.

FIG. 4 depicts an exemplary graph 400 that illustrates dependence of a calculated normalized steady state temperature (y-axis 402) and a normalized chemical reaction rate (y-axis 404) from a distance (x-axis 406) from a center of the nanoheater 212*d*. In this calculation an approximate "semi-infinite" object is assumed. In one embodiment, the nanoheater 212*d* has a 20 nm square heat-emitting surface 346 that is in a "soft" contact with the substrate 202. In the depicted embodiment, the attained temperature in the center (i.e., at the distance "0") of the region 204 is about 300 degrees Celsius (e.g., it is normalized—temperature will scale with power deposited from the nanoheater on the substrate—the resulting temperature will depend (to a first order) on thermal conductivity of object) and a width 410 (e.g., the width bar is not at the 50% level) of the temperature distribution at 50% of a peak 408 is about 56 nm. In this embodiment, a width of the distribution of a reaction rate for a chemical reaction having a 50 kJ/mol activation barrier is about 20 nm, or, approximately, three times narrower than the width 410 of the temperature distribution of the region 204. For comparison, at optical frequencies, a minimal width of the focusing spot of a laser beam is about 300 nm, or about 5-6 times greater than the width 410.

In exemplary embodiments discussed below, the method 100 is used to perform local chemical alterations and form microstructures using various etch and deposition processes. The fabricated microstructures include portions of integrated circuits and field effect transistors, defect-eliminating features, and information patterns written on recording media, among other microstructures.

Figure 5:
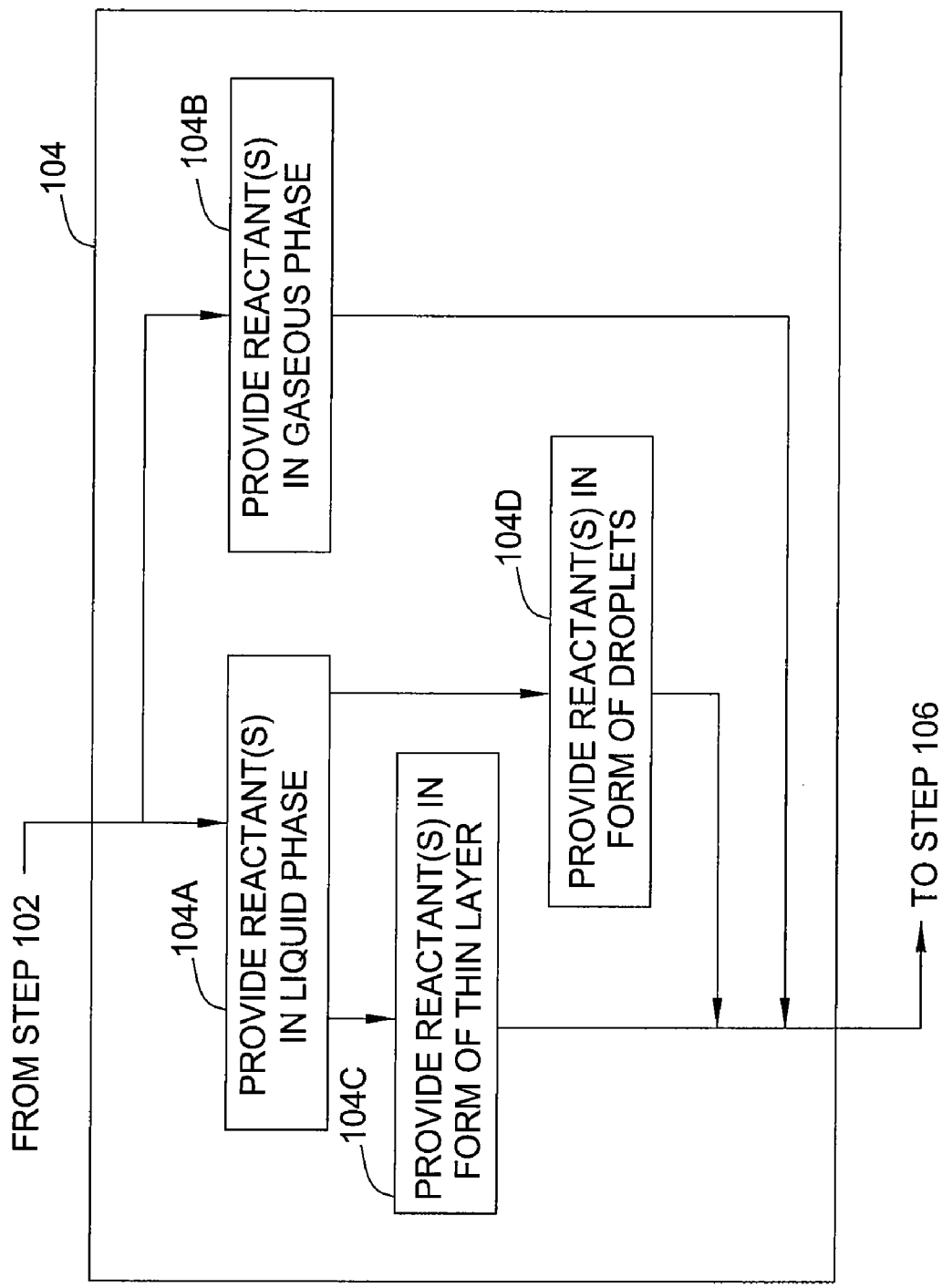
FIG. 5 depicts a flow diagram illustrating embodiments of a portion of the method of FIG. 1 in various applications of the present invention.

FIG. 5 depicts optional sub-steps 104A-104D that may be a part of step 104 in the exemplary embodiments of the method 100. Specifically, reactants for the local chemical reactions may be provided in a liquid phase (sub-step 104A) or in a gaseous phase (sub-step 104B) or a solid phase (not shown). Liquid phase reactants may be deposited on the substrate 202 in a form of a thin layer (sub-step 104C) covering a substantial portion of the substrate surface (e.g., entire substrate surface). Alternatively, liquid reactants may be deposited in the form of droplets (sub-step 104D) which are substantially limited to the regions 204 of the substrate. In a further embodiment, depending on a specific application of the method 100, the reactants may be provided using any combination of sub-steps 104A-104D, e.g., some reactants may be provided in the liquid phase, while at least one reactant is provided in the gaseous phase.

FIGS. 6A-6D depict a series of exemplary applications of the method 100 for fabricating defect-eliminating microstructures and/or repairing lithographic reticles/masks and integrated circuits. Depending on a specific chemical composition of the reactants, the method 100 can facilitate at least one of localized deposition and etch reactions. In these embodiments, the reactants are illustratively applied in a liquid phase and in the form of a thin layer over a surface area 610 that is substantially greater that the region 204 of the substrate 202 (discussed above in reference to FIG. 2). FIGS. 6A and 6C depict a state of the localized deposition and etch chemical reactions, respectively, prior to energizing the nanoheater (means for heating) 212 (e.g., nanoheater 212*d*). Accordingly, FIGS. 6B and 6D depict the results of the corresponding reactions when facilitated by the nanoheater 212*d* (shown after the remaining reactants have been removed). The images in FIGS. 6A-6D are not depicted to scale and are simplified for illustrative purposes.

FIG. 6A depicts the substrate 202 illustratively comprising lines 602 and 604 that should be interconnected. As such, the reactants are selected such that, when react at high temperature produced by the nanoheater 212*d*, can form a desired interconnecting material (e.g., same material as that of the lines 602 or 604). In a further embodiment, the region 204 may include a contact hole (i.e., via) or a contact pad, as well as lines 602 and 604 may each be a portion of various devices of the integrated circuit or lithographic reticle. For example, when the lines 602 and 604 are formed from Aluminum, the reactants may comprise, triethyl-aluminum.

FIG. 6B depicts a microstructure 606 interconnecting the lines 602 and 604 of the kind that may be formed using the localized chemical reaction. To heat the reactants to the high temperature facilitating such a reaction, the nanoheater 212 may be energized using one or more short pulses of an electric current. Depending on the application, the microstructure 606 may be either a defect-eliminating feature (e.g., a missing or erroneously burned jumper) or a new feature of the integrated circuit or lithographic reticle/mask. As discussed above, beyond the region 204, the rate of the same chemical reaction in negligible.

FIG. 6C depicts an alternative embodiment when a line 612 is a solid conductive line that should be interrupted, or opened. In this embodiment, the reactants are selected such that, when react at high temperature produced by the nanoheater 212, can remove (i.e., etch) the material of the line 612. In a further embodiment, the line 612 may be formed from a dielectric material, such as an optically transparent phase-shifting portion of a lithographic reticle, a dielectric pad of a capacitor, and the like.

FIG. 6D depicts a result of the localized chemical reaction of the kind that may etch and remove the material of the line 612 in the region 204 heated by the means for heating, e.g., a nanoheater, 212, thus forming a gap 614 between portions 612A and 612B of the line 612. Similar to the embodiment of FIGS. 6A-6B, beyond the region 204, the rate of the same chemical reaction in negligible. The gap 614 may be considered as a defect-eliminating feature (e.g., when the line 612 was erroneously formed as the solid line) or a new feature (e.g., programming feature) of the integrated circuit or an opaque region of the lithographic reticle. Defects having topographic dimensions less than the region 204 (e.g., metallic droplets in a transparent portion of the lithographic reticles/masks) may also be removed using the same localized etch reaction. In another application, localized etch reaction may be used to etch or decompose low-k dielectrics, prepare samples for focused ion beam (FIB) and scanning electron microscope (SEM) analysis, and the like.

FIGS. 7A-7F illustrate an exemplary application of the method 100 during fabricating of a field effect transistor (FET) using a sequence of localized chemical vapor deposition (CVD) processes that use gaseous phase reactants. During such a CVD process, precursors are absorbed on exposed surfaces. In this application, local decomposition of the precursors by means of pyrolysis is initiated in the heat spot (i.e., region 204) generated by the means for heating the object 210. At least one of the products of the CVD gas becomes a solid and remains on a surface of the substrate after such local heat treatment. The precursor gas could be changed and different materials may be deposited to build electronic circuits. For example, a gaseous precursor containing a copper compound can be used to trace out patterns of missing or broken copper circuit lines on a chip with a resolution previously not possible by presently known techniques. Such chemical alterations of both metals and insulators may be performed without use of a mask, which is an advantage of the invention. The images in FIGS. 7A-7F are not depicted to scale and are conventionally simplified for illustrative purposes.

Figure 7A:
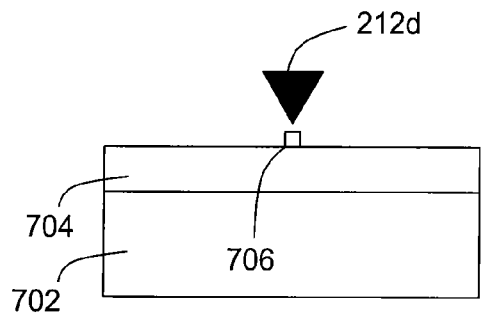
FIGS. 7A-7F depict a series of schematic, cross-sectional views of a substrate having a field effect transistor being fabricated using the method of FIG. 1.

FIG. 7A depicts a substrate 702 (e.g., silicon (Si) wafer) having a silicon dioxide ($SiO_2$) layer 704 where a seed germanium (Ge) layer 706 is formed using non-selective Ge chemistry and a localized CVD process facilitated by the means for heating the object, e.g., a nanoheater 212d.

Figure 7D:
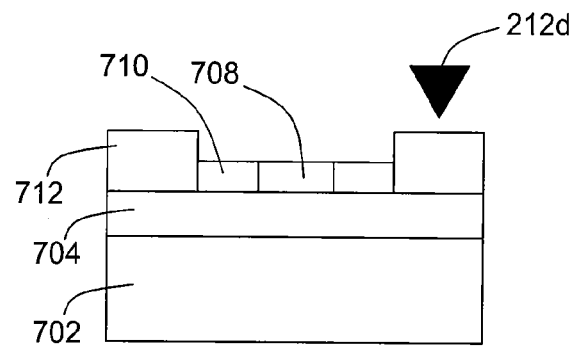
Figure 7B:
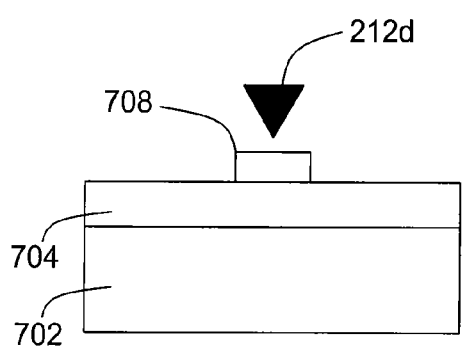

FIG. 7B depicts the substrate 702 after the Ge layer 708 (i.e., channel region) has been grown, from the seed layer, in the heat spot of the nanoheater 212d using selective Ge chemistry and the localized CVD process.

Figure 7E:
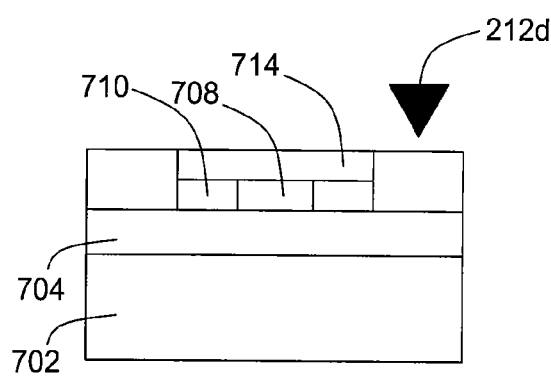
Figure 7C:
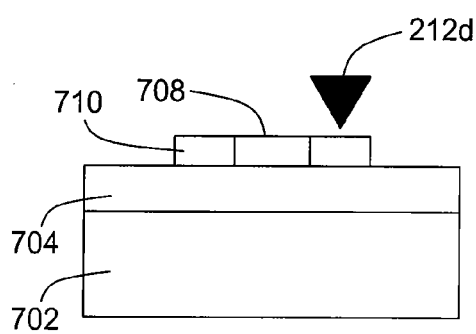

FIG. 7C depicts the substrate 702 after source and drain regions 710 of the transistor have been sequentially formed, in a heat spot of the nanoheater 212d, using selective chemistry and the localized CVD process.

FIG. 7D depicts the substrate 702 after metal contacts 712 (e.g., gold (Au), and the like) have been sequentially formed, in a heat spot of the nanoheater 212d, using the localized CVD process.

Figure 7F:
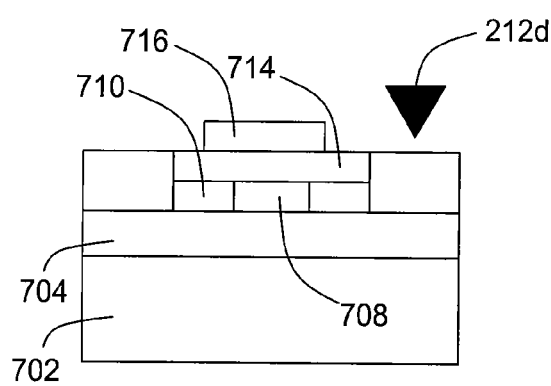

FIGS. 7E and 7F depict the substrate 702 after a gate dielectric 714 (e.g., $GeO_2$) and a gate electrode 716 (e.g., Au) have been formed using the respective conventional CVD processes.

In yet another application, the method 100 may be used to form an information-containing portion of recording media, e.g., write information on digital video (DVD) discs and compact "read only" (CD-ROM) disks. Such disks may use Polymethyl metacrylrate (PMMA) material that is spun over a surface of the disc. The means for heating the object can initialize a free radical vinyl polymerization process to form locally the PMMA-plastic material. A radical starter may further be used to enhance the process. The unreacted (i.e., unheated) regions are washed off to complete fabrication of a PMMA mask. Such a mask may be used in a servo loop during patterning optical disk drives.

In still another application, the method 100 may be used to facilitate and enhance a broad range of localized biochemical reactions, e.g., protein-related reactions.

While the foregoing is directed to the illustrative embodiment of the present invention, other and further embodiments of the invention may be devised without departing from the basic scope thereof, and the scope thereof is determined by the claims that follow.

The invention claimed is:

1. An apparatus for chemically fabricating or altering a submicrostructure on an object via a local chemical reaction, comprising:
a means for heating a local region on the object, said means for heating including a heater element fixedly embedded in a thermally conductive enclosure; and
a controller for positioning the means for heating proximate to said local region of the object; and
at least one reactant supplied on the local region, where the local chemical reaction is facilitated by the means for heating raising a temperature of the at least one reactant, wherein the local chemical reaction causes a deposition of the at least one reactant on the local region to form the submicrostructure.

2. The apparatus of claim 1, wherein the at least one reactant is supplied in at least one of: a liquid phase, a solid phase, or a gaseous phase, where the liquid phase comprises at least one of: a thin layer form or a droplet form.

3. The apparatus of claim 1, wherein the means for heating comprises a nanoheater.

4. The apparatus of claim 1, wherein the submicrostructure is a defect-eliminating feature formed or altered on a portion of a lithographic reticle or mask.

5. The apparatus of claim 1, wherein the submicrostructure is a portion of a field effect transistor.

6. The apparatus of claim 1, wherein the submicrostructure is an information-containing portion of a recording medium.

7. The apparatus of claim 1, wherein the heat element is fully enclosed within the thermally conducting enclosure such that the heater element does not directly contact the submicrostructure.

8. The apparatus of claim 1, wherein the at least one reactant is separate from the object.

9. The apparatus of claim 1, wherein the means for heating comprises a thermal transducer.

10. The apparatus of claim 9, wherein the thermally conductive enclosure has topographic dimensions in a range of about 10 to 200 nm.

11. The apparatus of claim 1, further comprising a heat-conductive medium provided between said means for heating and said local region.

12. The apparatus of claim 11, wherein the heat-conductive medium comprises at least one of: a lubricant or a reactant.

13. The apparatus of claim 1, wherein the submicrostructure is a portion of an integrated circuit.

14. The apparatus of claim 13, wherein the portion of the integrated circuit is at least one of: a line, a conductive via, a contact pad, or a dielectric pad.

15. The apparatus of claim 1, wherein said thermally conductive enclosure comprises a cantilever, wherein a first end of said cantilever is coupled to said controller.

16. The apparatus of claim 15, further comprising:
a plurality of power leads at least partially embedded in the cantilever, wherein the plurality of power leads couple the heater element to a power source located external to the cantilever.

17. The apparatus of claim 1, wherein said thermally conductive enclosure comprises a thermally conductive plate.

18. The apparatus of claim 17, further comprising:
a nano-tip coupled to said thermally conductive plate; and
a plurality of power leads at least partially embedded in the thermally conductive plate, wherein the plurality of power leads couple the heater element to a power source located external to the thermally conductive plate.

19. An apparatus for chemically fabricating or altering a submicrostructure on an object via a local chemical reaction, comprising:
a means for heating a local region on the object, said means for heating including a heater element fixedly embedded in a thermally conductive enclosure; and
a controller for positioning the means for heating proximate to said local region of the object; and
at least one reactant supplied on the local region, where the local chemical reaction is facilitated by the means for heating raising a temperature of the at least one reactant, wherein the at least one reactant is supplied in a liquid phase.

20. An apparatus for chemically fabricating or altering a submicrostructure on an object via a local chemical reaction, comprising:
- a means for heating a local region on the object, said means for heating including a heater element fixedly embedded in a thermally conductive enclosure; and
- a controller for positioning the means for heating proximate to said local region of the object; and
- at least one reactant supplied on the local region, where the local chemical reaction is facilitated by the means for heating raising a temperature of the at least one reactant, wherein the at least one reactant is supplied in a gaseous phase.

* * * * *